(12) United States Patent
Kollmann et al.

(10) Patent No.: US 10,305,610 B2
(45) Date of Patent: *May 28, 2019

(54) PHASE AND AMPLITUDE SIGNAL SENSING CIRCUIT FOR RADIO FREQUENCY (RF) TRANSMITTERS

(71) Applicant: Infineon Technologies AG, Neubiberg (DE)

(72) Inventors: Helmut Kollmann, Linz (AT); Jochen Oliver Schrattenecker, Reichenthal (AT); Florian Starzer, Ennsdorf bei Enns (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/952,808

(22) Filed: Apr. 13, 2018

(65) Prior Publication Data

US 2018/0234193 A1  Aug. 16, 2018

Related U.S. Application Data

(63) Continuation of application No. 15/270,747, filed on Sep. 20, 2016, now Pat. No. 9,948,409.

(51) Int. Cl.
*H04B 1/00* (2006.01)
*H04B 1/04* (2006.01)
(Continued)

(52) U.S. Cl.
CPC ............ *H04B 17/13* (2015.01); *H03F 3/195* (2013.01); *H03F 3/245* (2013.01); *H04B 1/0007* (2013.01);
(Continued)

(58) Field of Classification Search
None
See application file for complete search history.

(56) References Cited

U.S. PATENT DOCUMENTS 5,109,545 A * 4/1992 Schiller .................. H04B 1/408
455/208
6,016,422 A   1/2000 Bartusiak
(Continued)

OTHER PUBLICATIONS

"All About Mixers as Phase Detectors." All About Mixers as Phase Detectors/Marki Microwave RF & Microwave Tech Notes. Feb. 11, 2015. pp. 1-6.
(Continued)

*Primary Examiner* — Lana N Le
(74) *Attorney, Agent, or Firm* — Eschweiler & Potashnik, LLC

(57) ABSTRACT

A radio frequency (RF) transmitter for self-sensing power and phase of an RF signal is provided. A local oscillator (LO) is configured to generate a LO signal. A power amplifier is configured to generate the RF signal from the LO signal, wherein the LO and RF signals are periodic signals sharing a waveform and a frequency. An IQ demodulator is configured to down convert the LO signal and the RF signal into an in-phase (I) signal and a quadrature (Q) signal, wherein direct current (DC) voltages respectively of the I and Q signals define power and phase of the RF signal. A method for self-sensing power and/or phase of an RF signal, and a radar system within which the RF transmitter is arranged, are also provided.

20 Claims, 5 Drawing Sheets

(51) Int. Cl.
  *H04B 17/13*       (2015.01)
  *H03F 3/195*       (2006.01)
  *H03F 3/24*        (2006.01)

(52) U.S. Cl.
  CPC ......... *H04B 1/04* (2013.01); *H03F 2200/336* (2013.01); *H03F 2200/451* (2013.01); *H04B 2001/0416* (2013.01)

(56) References Cited

U.S. PATENT DOCUMENTS

| | | | |
|---|---|---|---|
| 6,404,293 B1* | 6/2002 | Darabi | H03B 21/01 |
| | | | 331/37 |
| 7,706,978 B2 | 4/2010 | Schiffmann | |
| 9,331,633 B1* | 5/2016 | Robertson | H03D 7/14 |
| 9,621,387 B1* | 4/2017 | Magers | H03C 3/40 |
| 9,948,409 B2* | 4/2018 | Kollmann | H04B 17/13 |
| 2001/0010713 A1 | 8/2001 | Yamamoto | |
| 2004/0106380 A1* | 6/2004 | Vassiliou | H04B 17/14 |
| | | | 455/73 |
| 2006/0189285 A1 | 8/2006 | Takano | |
| 2007/0184797 A1 | 8/2007 | Okada | |
| 2008/0051051 A1 | 2/2008 | Kral | |
| 2010/0253345 A1 | 10/2010 | Vester | |
| 2010/0285762 A1 | 11/2010 | Ko | |
| 2010/0323640 A1 | 12/2010 | Lozhkin | |
| 2011/0306314 A1 | 12/2011 | Noujeim | |
| 2013/0051492 A1* | 2/2013 | Hansen | H03F 1/3247 |
| | | | 375/297 |
| 2014/0241463 A1* | 8/2014 | Leenaerts | H04B 7/0617 |
| | | | 375/299 |
| 2014/0329482 A1 | 11/2014 | Wagner | |
| 2015/0139348 A1* | 5/2015 | Tong | H04B 7/068 |
| | | | 375/267 |
| 2016/0036486 A1* | 2/2016 | Sestok, IV | H04B 1/1027 |
| | | | 455/77 |
| 2016/0043822 A1 | 2/2016 | Yi | |
| 2016/0218900 A1* | 7/2016 | Smaini | H04B 1/04 |
| 2016/0245911 A1 | 8/2016 | Wang | |
| 2016/0268998 A1 | 9/2016 | Xu | |
| 2016/0277078 A1* | 9/2016 | Trotta | H04L 7/0331 |
| 2017/0063425 A1 | 3/2017 | Khlat et al. | |
| 2017/0149588 A1* | 5/2017 | Yang | H04B 1/00 |

OTHER PUBLICATIONS

"Automotive 77 GHz radar system." Back to Advanced driver assistant systems—ADAS (/cms/en/applications/automotive/safety/adas/). Jul. 19, 2016. pp. 1-4.

"Highly Integrated and Performance Optimized. 32bit Microcontrollers for Automotive and Industrial Applications." Infineon. 58 pages.

"Mixers." EverythingRF.com. 3 pages.

Non-Final Office Action dated Apr. 21, 2017 in connection with U.S. Appl. No. 15/270,747.

Final Office Action dated Oct. 11, 2017 in connection with U.S. Appl. No. 15/270,747.

Notice of Allowance dated Dec. 21, 2017 in connection with U.S. Appl. No. 15/270,747.

* cited by examiner

US 10,305,610 B2

PHASE AND AMPLITUDE SIGNAL SENSING CIRCUIT FOR RADIO FREQUENCY (RF) TRANSMITTERS

REFERENCE TO RELATED APPLICATIONS

This Application is a continuation of prior application Ser. No. 15/270,747, filed Sep. 20, 2016, the contents of which are hereby incorporated by reference in their entirety.

FIELD

The present disclosure relates to a power and phase self-sensing circuit for radio frequency (RF) transmitters, such as, for example, radar transmitters.

BACKGROUND

Some radio frequency (RF) transmitters include self-sensing circuits configured to measure the power and/or the phase of transmit signals. For example, RF transmitters for 77 gigahertz (GHz) automotive radar systems often include self-sensing circuits. The power measurements are important to ensure that the RF transmitters do not violate rules and regulations regarding maximum transmit power. The phase measurements are important for multiple-input and multiple-output (MIMO) applications of the RF transmitters.

One type of self-sensing circuit comprises separate components for power and phase. A diode averages an RF signal that is transmit and generates a direct current (DC) voltage that is proportional to the power of the RF signal. The RF signal is generated from a local oscillator (LO) signal, such that the RF signal has the same frequency as the LO signal. A double-sideband mixer receives the RF signal and the LO signal, and generates an intermediate frequency (IF) signal with a DC voltage that is proportional to the phase shift between the RF signal and the LO signal. A challenge with the self-sensing circuit is phase ambiguity since the DC voltage of the IF signal may correspond to two different phases. For example, the DC voltage may correspond to a phase in a left or right hemisphere of a polar coordinate system.

One solution to address the phase ambiguity is to employ an additional component, an IQ modulator, to shift the phase of the RF signal or the LO signal up and/or down before it passes to the double-sideband mixer. For example, the phase of the RF or LO signal may be shifted with the IQ modulator by adjusting the in-phase (I) signal of the IQ modulator and the quadrature (Q) signal of the IQ modulator. Depending on how the DC voltage of the IF signal changes in response to the phase shift, the phase between the RF signal and the LO signal can be determined without phase ambiguity.

While the self-sensing circuit provides power and phase measurements, it's dependent upon multiple components. For example, the self-sensing circuit has two components for power and phase measurement with phase ambiguity, and three components for power and phase measurements without phase ambiguity. The multiple components consume large amounts of area in integrated circuits (ICs) or on printed circuit boards (PCBs). Further, the multiple components lead to long testing and verification times, and also to high failure rates. Accordingly, the multiple components lead to high costs.

SUMMARY

The present disclosure provides a self-sensing circuit with a single component, an IQ de-modulator, for measuring both power and phase of a radio frequency (RF) signal. The IQ de-modulator down converts the RF signal to an in-phase (I) signal and a quadrature (Q) signal, which include respective direct current (DC) voltages collectively representing power and phase in a two dimensional (2D) Cartesian coordinate system. Power and phase can then be calculated from the I and Q signals by converting a 2D Cartesian coordinate defined by the DC voltages to a polar coordinate system. For example, power may be the square root of the sum calculated by adding the square of the DC voltage of the I signal and the square of the DC voltage of the Q signal. As another example, phase may be determined without phase ambiguity by determining a radial quadrant using signs of the DC voltages, calculating an angle between the DC voltages using arctangent, and correcting the angle for the determined radial quadrant.

Advantageously, the self-sensing circuit provides power and phase measurements with a single component, the IQ modulator. As such, a small amount of area is consumed in an integrated circuit (IC) or on a printed circuit board (PCB), and testing and verification times are small, thereby keeping costs low. Further, the self-sensing circuit advantageously measures phase without phase ambiguity.

DETAILED DESCRIPTION

The following detailed description makes reference to the accompanying drawings which constitute a part of the disclosure and in which, for purposes of illustration, special example embodiments are shown, whereby the disclosure can be practically realized. It is understood that other example embodiments may be employed, and that structural and other changes may be implemented, without going beyond the scope of protection of the present disclosure. Thus, the following detailed description should not be regarded as being limitative. Rather, the scope of protection of the present disclosure is defined only by the accompanying patent claims.

Figure 1:
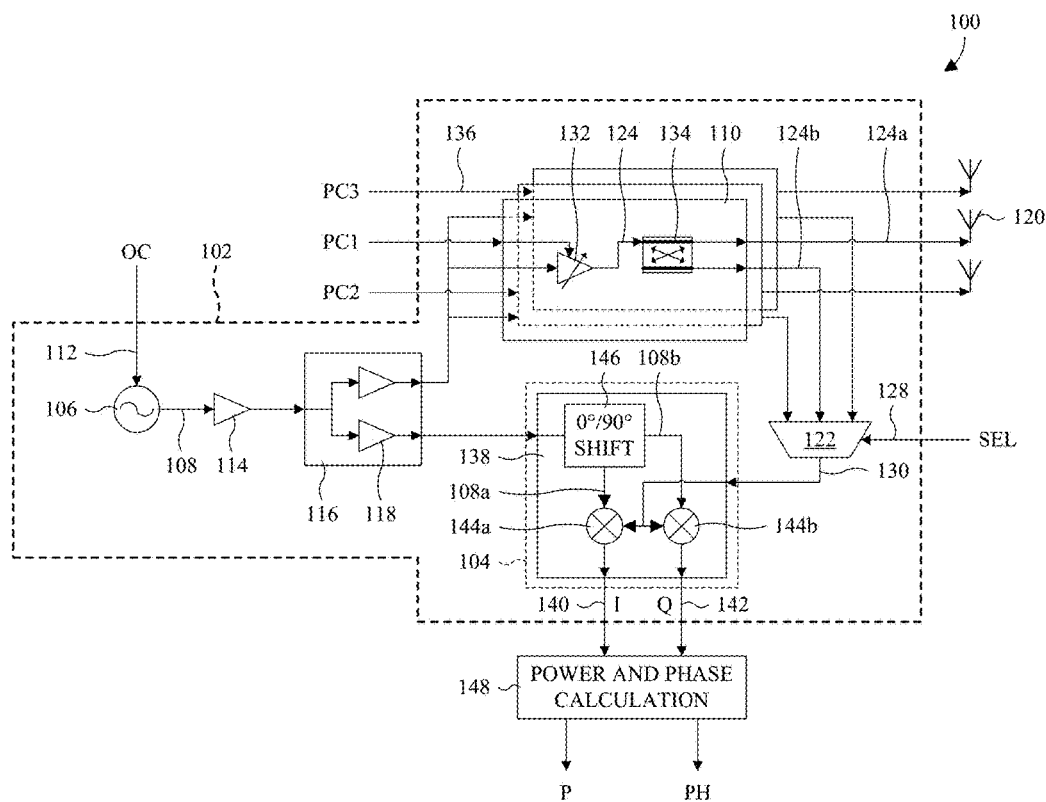
FIG. 1 illustrates a block diagram of some embodiments of radio frequency (RF) transmitter with a self-sensing circuit for power and phase.

With reference to FIG. 1, a block diagram 100 of some embodiments of a radio frequency (RF) transmitter 102 with a self-sensing circuit 104 for power and phase is provided. The RF transmitter 102 may, for example, be used within an automotive radar system. As illustrated, a local oscillator (LO) 106 is configured to generate a LO signal 108 that is provided to a plurality of transmit elements 110 and the self-sensing circuit 104. For ease of illustration, only one of the transmit elements 110 is labeled. In some embodiments, the LO 106 is voltage controlled and is configured to generate the LO signal 108 based on an oscillator control (OC) signal 112. For example, the LO 106 may generate the LO signal 108 with a frequency that is proportional to a direct current (DC) voltage of the OC signal 112. The LO signal 108 may, for example, be a sine wave, and/or may, for example, have a frequency of about 76-77 gigahertz (GHz).

In some embodiments, the LO signal 108 is provided to the transmit elements 110 and the self-sensing circuit 104 through a buffer amplifier 114 and/or a LO splitter 116. The buffer amplifier 114 is configured to prevent loading of the LO 106 by the transmit elements 110 and the self-sensing circuit 104, since such loading may negatively impact the performance of the LO 106. For example, the buffer amplifier 114 may translate between an output impedance of the LO 106 and an input impedance to one or more downstream components, such as the LO splitter 116. Further, in some embodiments, the buffer amplifier 114 has unity gain so the LO signal 108 is passed substantially unchanged. The LO splitter 116 is configured to split and distribute the LO signal 108 to the transmit elements 110 and the self-sensing circuit 104. In some embodiments, the LO splitter 116 comprises a plurality of splitter amplifiers 118 configured to compensate for signal loss resulting from splitting the LO signal 108. For ease of illustration, only one of the splitter amplifiers 118 is labeled. Further, in some embodiments, the LO signal 108 has the same power after the LO splitter 116 as before the LO splitter 116.

The transmit elements 110 are configured to provide corresponding antennas 120 and a multiplexer 122 with corresponding RF signals 124 generated from the LO signal 108. For ease of illustration, only one of the antennas 120 and only one of the RF signals 124 are labeled. The antennas 120 are configured to convert the RF signals 124 into radio waves and may be, for example, metallic structures. The multiplexer 122 is configured to select one of the RF signals 124 based on a select signal 128 and to output a selected RF signal 130. The transmit elements 110 include corresponding transmit amplifiers 132 and corresponding transmit splitters 134. For example, there may be a one-to-one correspondence between the transmit elements 110 and the transmit amplifiers 132, and/or the transmit elements 110 and the transmit splitters 134.

The transmit amplifiers 132 are configured to amplify the LO signal 108 into the RF signals 124. Further, in some embodiments, the transmit amplifiers 132 amplify the LO signal 108 based on corresponding power control (PC) signals 136. For example, a transmit element may amplify the LO signal 108 with a gain that is proportional to a DC voltage of the corresponding PC signal. The PC signals 136 may, for example, be set or otherwise defined for multiple-input and multiple-output (MIMO) and/or beam forming applications of the RF transmitter 102. For ease of illustration, only one of the PC signals 136 is labeled. Since the RF signals 124 are generated by amplification of the LO signal 108, the RF signals 124 have the same frequency and waveform as the LO signal 108. However, the RF signals 124 are subject to phase shifts relative to the LO signal 108 due to, for example, signal delay introduced by components of the transmit elements 110, such as the transmit amplifiers 132.

The transmit splitters 134 are configured to split and distribute the RF signals 124 to the antennas 120 and the multiplexer 122. In some embodiments, the transmit splitters 134 are directional couplers configured to pass the RF signals 124 to corresponding antennas 120 as main RF signals 124a, and to pass the RF signals 124 to the multiplexer 122 as coupled RF signals 124b. The main RF signals 124a may be unchanged or have minimal signal loss relative to the RF signals 124, whereas the coupled RF signals 124b may have signal loss relative to the RF signals 124 and are coupled to the RF signals 124 in only one direction.

The self-sensing circuit 104 is configured to measure power and phase of the selected RF signal 130, and is or comprises an IQ de-modulator 138. The IQ de-modulator 138 is configured to down convert the LO signal 108 and the selected RF signal 130 into an in-phase (I) signal 140 and a quadrature (Q) signal 142 that are in quadrature and that share a common frequency and waveform. Collectively, the I and Q signals 140, 142 represent the power and phase of the selected RF signal 130, where the phase of the selected RF signal 130 is relative to the LO signal 108. DC voltages of the I and Q signals 140, 142 can be thought of as a coordinate in a two-dimensional (2D) Cartesian coordinate system, whereas power and phase can be thought of as a coordinate in a polar coordinate system is determined by converting the 2D Cartesian coordinate to the polar coordinate system.

In some embodiments, the IQ de-modulator 138 comprises a pair of mixers 144a, 144b and a 0/90 degree phase shifter 146. The mixers 144a, 144b may be, for example, double-sideband mixers, and the 0/90 degree phase shifter 146 may be, for example, a quadrature hybrid coupler. The 0/90 degree phase shifter 146 is configured to split the LO signal 108 into first and second LO signals 108a, 108b respectively with a zero degree phase shift and a 90 degree phase shift. The mixers 144a, 144b are configured to mix the selected RF signal 130 respectively with the first and second LO signals 108a, 108b to respectively generate the I and Q signals 140, 142.

A power and phase calculation module 148 is configured to calculate the power and phase of the selected RF signal 130 from the I and Q signals 140, 142. Further, in some embodiments, the power and phase calculation module 148 corrects the calculated phase for a phase offset of the LO signal 108 since the calculated phase is relative to the LO signal 108. For example, the phase offset of the LO signal 108 may be determined during calibration or testing of the RF transmitter 102, and/or may be subtracted from the calculated phase. The power and phase calculation module 148 may, for example, be implemented by analog or digital circuitry, and/or may, for example, be implemented by an electronic processor or a microcontroller.

Power P may, for example, be calculated according to Equation (1) by summing the square of the DC voltage $I_{DC}$ of the I signal 140 and the square of the DC voltage $Q_{DC}$ of the Q signal 142, and subsequently calculating the square root of the sum.

$$P = \sqrt{I_{DC}^2 + Q_{DC}^2} \qquad (1)$$

The calculated power is proportional to the actual power of the selected RF signal 130 and can therefore be used to monitor the transmit power of the RF transmitter 102, and to ensure that the RF transmitter 102 does not violate rules and regulations regarding maximum transmit power. For example, the calculated power can be translated to actually power using a model or lookup table translating between calculated power and actual power.

In some embodiments, phase Ph is calculated according to Equation (2) by dividing the DC voltage $Q_{DC}$ of the Q signal 142 by the DC voltage $I_{DC}$ of the I signal 140, and subsequently calculating the arctangent of the quotient.

$$Ph = \arctan\left(\frac{Q_{DC}}{I_{DC}}\right) \quad (2)$$

The calculated phase is proportional to the actual phase of the selected RF signal 130 and can therefore be used for MIMO and beamforming applications of the RF transmitter. However, the calculated phase is subject to phase ambiguity in that the calculated phase is only unique within a range or 0 to 180 degrees and may correspond to two different phases in a range of 0 to 360 degrees. Therefore, in other embodiments, phase Ph is calculated according to Equation (3) to achieve a resolution of 360 degrees. As seen in Equation (3), the signs of the DC voltages $I_{DC}$, $Q_{DC}$ of the I and Q signals 140, 142 are taken into account when calculating phase.

$$Ph = \begin{cases} \arctan\left(\frac{Q_{DC}}{I_{DC}}\right) & \text{if } I_{DC} > 0 \\ \arctan\left(\frac{Q_{DC}}{I_{DC}}\right) + \pi & \text{if } I_{DC} < 0 \text{ and } Q_{DC} \geq 0 \\ \arctan\left(\frac{Q_{DC}}{I_{DC}}\right) - \pi & \text{if } I_{DC} < 0 \text{ and } Q_{DC} < 0 \\ +\frac{\pi}{2} & \text{if } I_{DC} = 0 \text{ and } Q_{DC} > 0 \\ -\frac{\pi}{2} & \text{if } I_{DC} = 0 \text{ and } Q_{DC} < 0 \end{cases} \quad (3)$$

Advantageously, the self-sensing circuit 104 measures power and phase without phase ambiguity and with a single component, the IQ de-modulator 138. As such, a small amount of area is consumed in an integrated circuit (IC) or on a printed circuit board (PCB), and testing and verification times are small, thereby keeping costs low. While the power and phase calculation module 148 calculates more direct representations of power and phase from the I and Q signals 140, 142, it is not regarded as a component of the self-sensing circuit 104 since it merely manipulates the power and phase measurements in the I and Q signals 140, 142. Further, since the power and phase calculation module 148 can be implemented in software and modern RF systems often include microcontrollers or electronic processes, the power and phase calculation module 148 is unlikely to add additional components to a modern RF system.

In other embodiments, the RF transmitter 102 may be limited to a single transmit element. In such other embodiments, the multiplexer 122 may be omitted and the self-sensing circuit 104 may be electrically coupled directly to the single transmit element. Further, in other embodiments, the IQ de-modulator 138 may be replaced with another type of single-sideband mixer and/or the power and phase calculation module 148 may be omitted. Even more, in other embodiments, one or more phase shifters (not shown) may be arranged along one or more corresponding transmit paths of the transmit elements 110. For example, a phase shifter may be arranged between a transmit amplifier and a transmit splitter. The one or more phase shifters may, for example, each be employed to shift the phase of a corresponding RF signal when the corresponding RF signal cancels out or otherwise interferes with another RF signal. This may be determined during, for example, calibration of the RF transmitter 102 in which the self-sensing circuit 104 is used to measure the phase shifts of the RF signals 124. If two RF signals are out of phase by about 180 degrees, the two RF signals cancel or otherwise interfere with one another and a phase shifter can be added to shift one of the two RF signals.

Figure 2A:
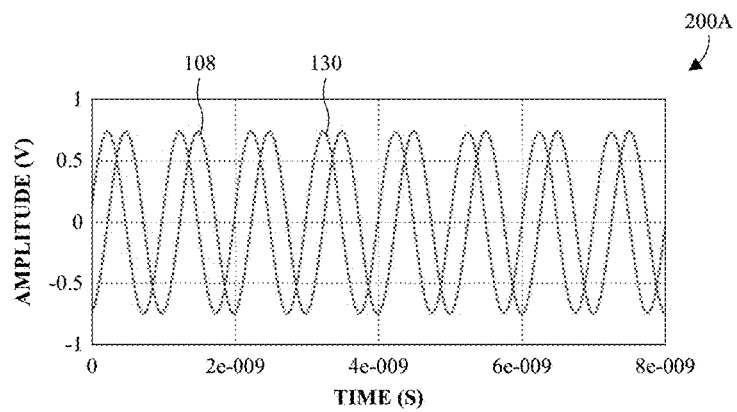
FIG. 2A illustrates a graph of some embodiments of local oscillator (LO) and RF signals of FIG. 1.

With reference to FIG. 2A, a graph 200A of some embodiments of the LO signal 108 and the selected RF signal 130 of FIG. 1 is provided. The dependent axis corresponds to amplitude in volts, and the independent axis corresponds to time in seconds. As illustrated, the LO signal 108 and the selected RF signal 130 are sine waves that are shifted from one another by about 90 degrees and that share the same frequency. Further, the LO signal 108 has a phase offset of about −90 degrees.

Figure 2B:
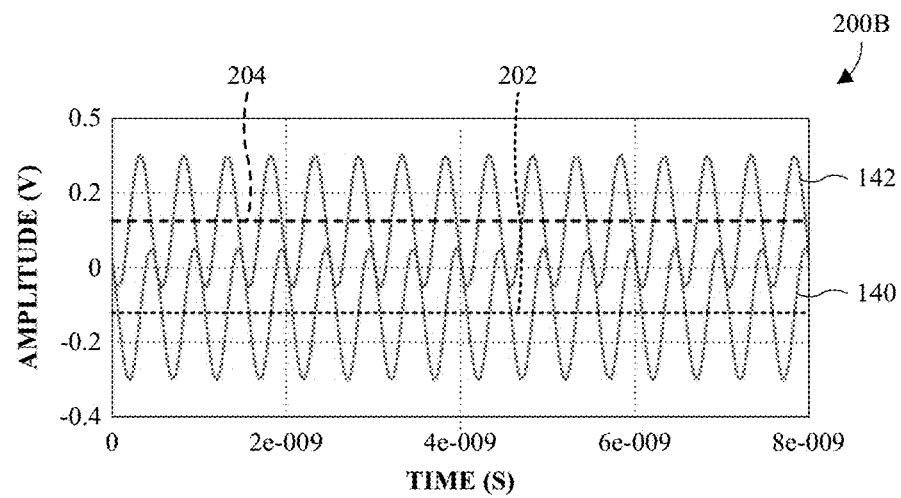
FIG. 2B illustrates a graph of some embodiments of in-phase (I) and quadrature (Q) signals of FIG. 1 resulting from the LO and RF signals of FIG. 2A.

With reference to FIG. 2B, a graph 200B of some embodiments of the I and Q signals 140, 142 of FIG. 1 is provided. The dependent axis corresponds to amplitude in volts, and the independent axis corresponds to time in seconds. As illustrated, the I and Q signals 140, 142 are the result of down converting the LO and selected RF signals 108, 130 of FIG. 2A with the IQ de-modulator 138 of FIG. 1. The I and Q signals 140, 142 are sine waves that are shifted from one another by 90 degrees and that share the same frequency. Further, the I and Q signals 140, 142 respectively have DC voltages of about −0.12 volts and about 0.12 volts. These DC voltages are highlighted by lines 202, 204 and advantageously allow phase and power of the selected RF signal 130 to be calculated.

Figure 3A:
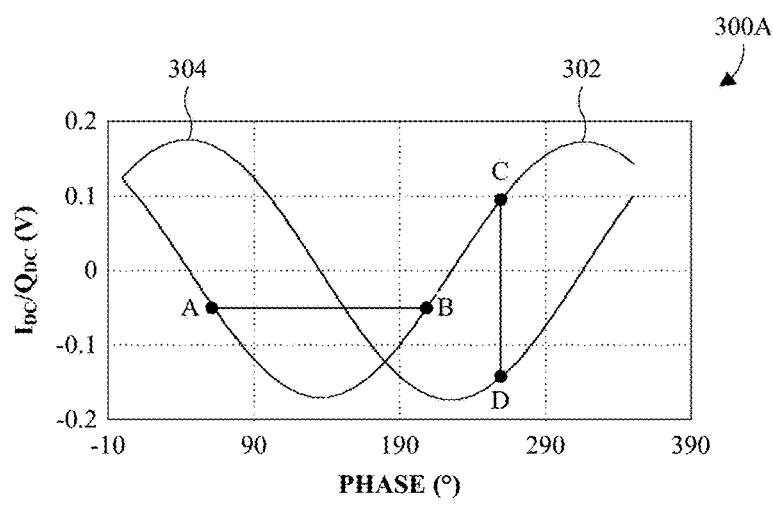
FIG. 3A illustrates a graph of some embodiments of direct current (DC) voltage curves respectively describing DC voltages of the I and Q signals of FIG. 1 over different phases.

With reference to FIG. 3A, a graph 300A of some embodiments of DC voltage curves 302, 304 respectively for the I and Q signals 140, 142 of FIG. 1 is provided. The DC voltage curves 302, 304 describe the DC voltages $I_{DC}$, $Q_{DC}$ of the I and Q signals 140, 142 over a range of phase shifts for the selected RF signal 130 of FIG. 1, while power of the selected RF signal 130 is constant. The dependent axis corresponds to the DC voltages $I_{DC}$, $Q_{DC}$ in volts (V), and the independent axis corresponds to the phase shift of the selected RF signal 130 relative to the LO signal 108 of FIG. 1 and in degrees (°).

As illustrated, the DC voltage curves 302, 304 are sine waves that share a common frequency and that are in quadrature, such that the DC voltage curves 302, 304 change systematically with phase shift and systematically relative to one another. Since the DC voltage curves 302, 304 both change systematically with phase shift, either one of the I and Q signals 140, 142 can be used to determine phase shift with a model or lookup table translating between DC voltage and phase. However, there are a few challenges with this approach.

A DC voltage from one of the I and Q signals 140, 142 can correspond to two phases, except for the minimum and maximum values of the DC voltage, such that the phase shift determination is limited to a resolution of 0 to 180 degrees. For example, as emphasized by line AB, a DC voltage of about −0.05 volts can correspond to phases of about 60 and 210 degrees respectively at points A and B. Without additional information, one cannot readily assess which of the two phases the DC voltage of about −0.05 volts corresponds to. Additionally, as described hereafter, the DC voltage curves 302, 304 change based on the power of the selected RF signal 130, such that the model or lookup table would also have to take into account power.

One solution to the foregoing challenges is to use both of the I and Q signals 140, 142 to determine phase shift. While the mathematical proof is beyond the scope of the present application, one of the properties of the I and Q signals 140, 142 is that the DC voltages $I_{DC}$, $Q_{DC}$ of the I and Q signals 140, 142 collectively encode the phase of the selected RF signal 130 as a 2D Cartesian coordinate. Therefore, by converting the 2D Cartesian coordinate to a polar coordinate, the phase of the selected RF signal 130 can be extracted without regard for power and/or with a resolution of 0 to 360 degrees. For example, Equations (2) and (3) above may be used to extract the phase shift from the 2D Cartesian coordinate.

Figure 3B:
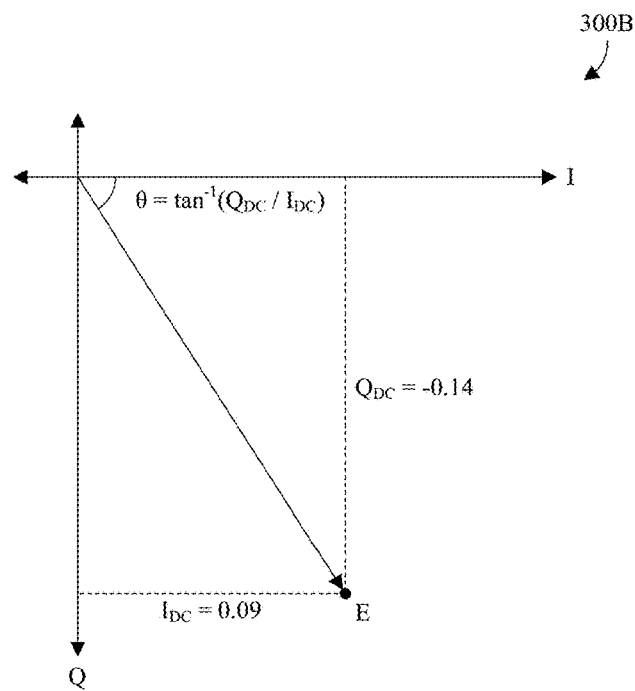
FIG. 3B illustrates a diagram of some embodiments of a two dimensional (2D) Cartesian coordinate system to demonstrate the calculation of phase along a line in FIG. 3A.

With reference to FIG. 3B, a diagram 300B of some embodiments of a 2D Cartesian coordinate system is provided to demonstrate the calculation of phase along line CD of FIG. 3A. The horizontal axis corresponds to the I signal 140 in FIG. 1 and the vertical axis corresponds to the Q signal 142 in FIG. 1. As illustrated, the DC voltages $I_{DC}$, $Q_{DC}$ of the I and Q signals 140, 142 at line CD are respectively about 0.09 volts and −0.14 volts, and collectively define a 2D Cartesian coordinate at point E. Using trigonometry, the 2D Cartesian coordinate is converted into a polar coordinate having a polar angle θ that represents the phase shift at line CD. Equations (2) and (3) describe two approaches that respectively identify the polar angle θ0 with a resolution of 180 degrees and 360 degrees.

In some embodiments, the polar angle θ is determined by dividing the DC voltage $Q_{DC}$ of the Q signal 142 at point D of FIG. 3A by the DC voltage $I_{DC}$ of the I signal 140 at point C of FIG. 3A, and subsequently taking the arctangent of the quotient. This results in about −57 degrees for the polar angle θ. However, −57 degrees does not correspond to the angle of line CD, which is about 260 degrees. In some embodiments where the polar angle θ is negative, it is converted to a range of 0 to 360 degrees. For example, the conversion may be performed by adding 360 degrees to the polar angle θ, thereby resulting in 303 degrees for the polar angle θ. Further, in some embodiments, the IQ de-modulator 138 introduces a phase shift into the I and Q signals 140, 142, such that a correction factor may be added to the polar angle θ. For example, as seen at a phase of 0 degrees in FIG. 3A, the IQ demodulator 138 introduces a phase shift of about 45 degrees, such that a −45 degree correction factor may be added to the polar angle θ. This results in about 260 degrees for the polar angle θ, which corresponds to line CD.

Figure 4A:
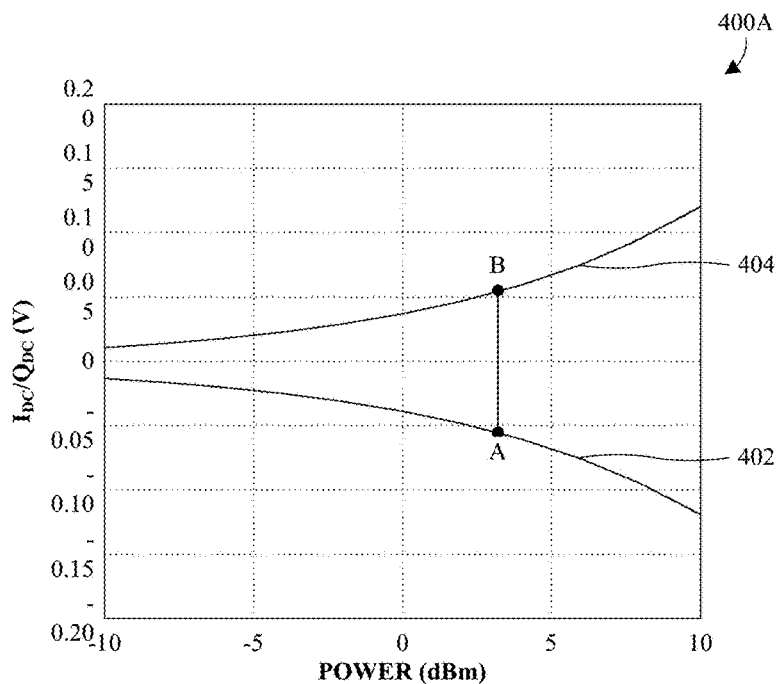
FIG. 4A illustrates a graph of some embodiments of DC voltage curves respectively describing DC voltages of the I and Q signals of FIG. 1 over different powers.

With reference to FIG. 4A, a graph 400A of some embodiments of DC voltage curves 402, 404 respectively for the I and Q signals 140, 142 of FIG. 1 is provided. The DC voltage curves 402, 404 describe the DC voltages of the I and Q signals 140, 142 over a range of power for the selected RF signal 130 of FIG. 1, while phase shift of the selected RF signal 130 is constant. The dependent axis corresponds to the DC voltages in volts, and the independent axis corresponds to the power in decibels referenced to one milliwatt (dBm).

As illustrated, the DC voltage curves 402, 404 are mirror images of one another and respectively have negative and positive exponential growth, such that magnitudes of the DC voltage curves 402, 404 increase systematically in proportion to the power of the selected RF signal 130. Since both of the DC voltage curves 402, 404 change systematically with power, one of the I and Q signals 140, 142 can be used to determine power with a model or lookup table translating between DC voltage and power. However, a challenge with this approach is that the DC voltage curves 402, 404 change based on the phase of the selected RF signal 130, such that the model or lookup table would also have to take into account phase.

One solution to the foregoing challenges is to use both of the I and Q signals 140, 142 to determine power. While the mathematical proof is beyond the scope of the present application, one of the properties of the I and Q signals 140, 142 is that the DC voltages $I_{DC}$, $Q_{DC}$ of the I and Q signals 140, 142 collectively encode the power of the selected RF signal 130 as a 2D Cartesian coordinate. Therefore, by converting the 2D Cartesian coordinate to a polar coordinate, the power of the selected RF signal 130 can be extracted without regard for phase. For example, Equation (1) above may be used to extract the power from the 2D Cartesian coordinate.

Figure 4B:
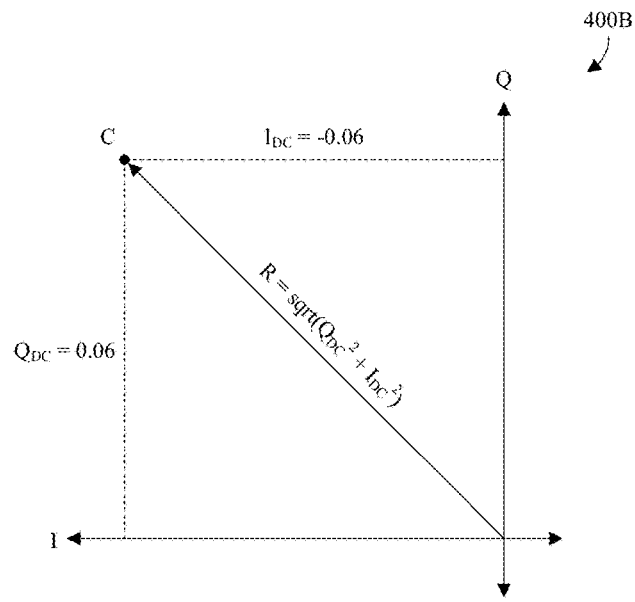
FIG. 4B illustrates a diagram of some embodiments of a 2D Cartesian coordinate system to demonstrate the calculation of power along a line in FIG. 4A.

With reference to FIG. 4B, a diagram 400B of some embodiments of a 2D Cartesian coordinate system is provided to demonstrate the calculation of power along line AB in FIG. 4A. The horizontal axis corresponds to the I signal 140 in FIG. 1 and the vertical axis corresponds to the Q signal 142 in FIG. 1. As illustrated, the DC voltages $I_{DC}$, $Q_{DC}$ of the I and Q signals 140, 142 at line AB are respectively about −0.06 volts and 0.06 volts, and collectively define a 2D Cartesian coordinate. Using the Pythagorean Theorem, described by Equation (1) above, the 2D Cartesian coordinate can be converted into a polar coordinate having a radial dimension R that is proportional to the power at line AB. For example, by summing the square of the DC voltage $I_{DC}$ of the I signal 140 at point A of FIG. 4A with the square of the DC voltage $Q_{DC}$ of the Q signal 142 at point B of FIG. 4A, and subsequently taking the square root of the sum, one arrives at radial dimension R of about 0.09 that is proportional to power. Notably, a model or lookup table may be used to translate the radial dimension R to dBm.

Figure 5:
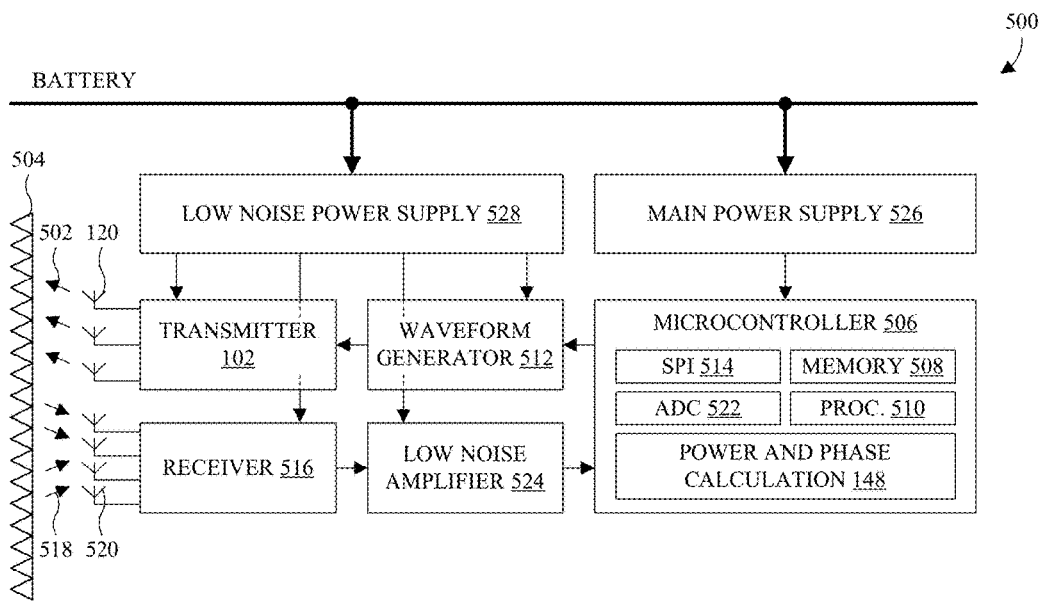
FIG. 5 illustrates a block diagram of some embodiments of a radar system within which the RF transmitter of FIG. 1 may be arranged.

With reference to FIG. 5, a block diagram 500 of some embodiments of a radar system within which the RF transmitter 102 of FIG. 1 may be arranged is provided. The radar system may, for example, be a 76 or 77 GHz automotive radar system. As illustrated the RF transmitter 102 is configured to drive corresponding transmit antennas 120 to emit radio waves 502 towards a radar target 504, and is controlled by a controller 506. For example, the controller 506 may control the oscillator control signal 112 of FIG. 1, the power control signals 136 of FIG. 1, the multiplexer select signal 128 of FIG. 1, or a combination of the foregoing. The controller 506 may be, for example, a microcontroller.

In some embodiments, the controller 506 controls the RF transmitter 102 based on phase and power encoded in the I and Q signals 140, 142 of FIG. 1 so as to perform MIMO and/or beamforming, and/or to ensure the power of the RF transmitter 102 does not exceed applicable rules and regulations. The phase and power may, for example, be determined for each of the transmit elements 110 of FIG. 1 through control of the multiplexer select signal 128. Further, in some embodiments, the controller 506 carries out such control with the aid of a power and phase calculation module 148. The power and phase calculation module 148 may, for example, extract power and phase from the I and Q signals 140, 142 for a more direct assessment of power and phase. Further, the power and phase calculation module 148 may, for example, be a software module stored on memory 508 of the controller 506 and executed by an electronic processor 510 of the controller 506.

The controller 506 interfaces with the RF transmitter 102 directly in some embodiments, and indirectly through a waveform generator 512 in other embodiments. The waveform generator 512 provides the controller 506 with a digital interface with the RF transmitter 102. For example, the waveform generator 512 may communicate with the controller 506 via a serial port interface (SPI) 514 of the controller 506, and/or may allow the controller 506 to indirectly control the oscillator control signal 112 of FIG. 1, the power control signals 136 of FIG. 1, or the multiplexer select signal 128 of FIG. 1.

An RF receiver 516 is configured to receive reflections 518 of the radio waves 502 off the radar target 504 via corresponding receive antennas 520. Representative signals of the received reflections 518 are passed to the controller 506 through an analog-to-digital converter (ADC) 522, where the signals are processed to identify the presence of the radar target 504. The ADC 522 may be, for example, internal to the controller 506, or external to the controller 506. In some embodiments, the signals also pass to the controller 506 through a low noise amplifier 524 for better conversion by the ADC 522.

The radar system is powered by one or more power supplies 526, 528 that may, for example, be connected to a battery, such as a 12V battery. In some embodiments, the one or more power supplies 526, 528 comprise a main power supply 526 powering the controller 506 and a low noise power supply 528 powering the transmitter 102, the waveform generator 512, the receiver 516, the low noise amplifier 524, or a combination of the foregoing. In other embodiments, the one or more power supplies 526, 528 comprise a single power supply powering the controller 506, the transmitter 102, the waveform generator 512, the receiver 516, and the low noise amplifier 524.

Figure 6:
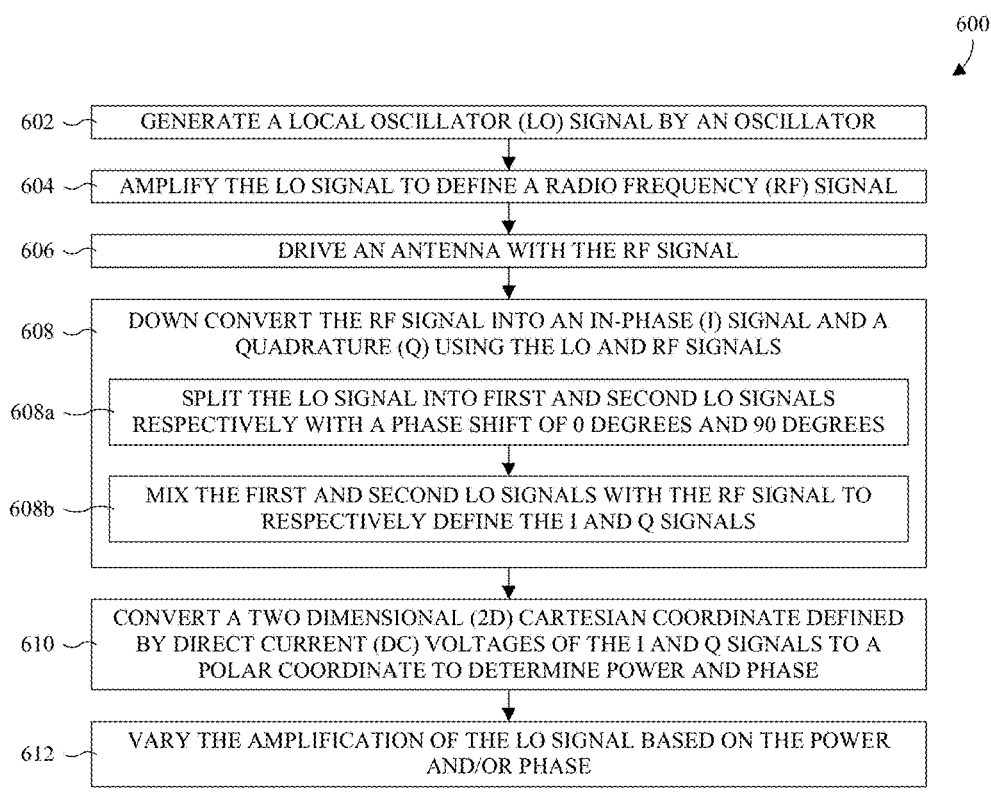
FIG. 6 illustrates a block diagram of some embodiments of a method for determining power and phase of an RF signal.

With reference to FIG. 6, a block diagram 600 of some embodiments of a method for determining power and phase of an RF signal is provided. The RF signal may, for example, be the selected RF signal 130 of FIG. 1. Further, the method may, for example, be performed by the RF transmitter 102 and/or the controller 506 of FIG. 5.

At 602, a LO signal is generated by an oscillator. The oscillator may, for example, generate the LO signal as a sine wave and/or with a frequency of about 76-77 GHz.

At 604, the LO signal is amplified to define a RF signal. The RF signal has the same frequency and waveform as the LO signal.

At 606, an antenna is driven with the RF signal. That is to say, the RF signal is applied to the antenna to generate radio waves.

At 608, the RF signal is down converted into an I signal and a Q signal using the RF and LO signals. Advantageously, DC voltages respectively of the I and Q signals define phase and power as a 2D Cartesian coordinate. In some embodiments, the down conversion is performed by an IQ de-modulator. Further, in some embodiments, the RF signal passes through a multiplexer that selects the RF signal over other RF signals.

The down conversion comprises, at 608a, splitting the LO signal into first and second LO signals respectively with a phase shift of 0 degrees and 90 degrees. Further, the down conversion comprises, at 608b, mixing the first and second LO signals with the RF signal to respectively define the I and Q signals.

At 610, the 2D Cartesian coordinate is converted to a polar coordinate to determine power and phase. Further, in some embodiments, a phase offset of the LO signal is subtracted or otherwise removed from the phase of the RF signal.

At 612, the amplification at 604 is varied based on the power and/or phase.

Thus, in some embodiments, the present disclosure provides a RF transmitter. A LO is configured to generate a LO signal. A power amplifier is configured to generate an RF signal from the LO signal, wherein the LO and RF signals are periodic signals sharing a waveform and a frequency. An IQ de-modulator is configured to down convert the LO signal and the RF signal into an I signal and a Q signal, wherein DC voltages respectively of the I and Q signals define power and phase of the RF signal.

In other embodiments, the present disclosure provides a method for measuring power and phase. A LO signal is generated. The LO signal is amplified to define a RF signal, wherein the LO and RF signals are periodic and share a waveform and a frequency. The RF signal is down converted into an I signal and a Q signal using the LO and RF signal with an IQ de-modulator, wherein DC voltages respectively the I and Q signals define power and phase of the RF signal.

In yet other embodiments, the present disclosure provides a radar system. A RF transmitter is configured to emit radio waves towards a target. The RF transmitter comprises a LO, a power amplifier, and an IQ de-modulator. The LO is configured to generate a LO signal. The power amplifier is configured to generate an RF signal from the LO signal, wherein the LO and RF signals are periodic signals sharing a waveform and a frequency. The IQ de-modulator is configured to down convert the LO signal and the RF signal into an I signal and a Q signal, wherein DC voltages respectively the I and Q signals define power and phase of the RF signal. An RF receiver is configured to receive reflections of the radio waves off the target. A controller is configured to control the RF transmitter and the RF receiver to identify the presence of the target.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A radio frequency (RF) transmitter comprising:
a local oscillator (LO) configured to generate a LO signal;
a splitter configured to receive the LO signal from the LO, and to further output the LO signal to a first splitter output of the splitter and a second splitter output of the splitter;
a transmit amplifier electrically coupled to the splitter through the first splitter output, wherein the transmit amplifier is configured to receive the LO signal from the first splitter output, and to generate an RF signal from the LO signal received from the first splitter output; and
an IQ de-modulator electrically coupled to the splitter through the second splitter output, wherein the IQ de-modulator is configured to receive the LO signal from the second splitter output, and to down convert the RF signal and the LO signal received from the second splitter output into a down-converted in-phase (I) signal and a down-converted quadrature (Q) signal;

wherein the RF transmitter is configured to determine at least one of a phase of the RF signal or a power of the RF signal from the down-converted I and Q signals.

2. The RF transmitter according to claim 1, wherein the IQ de-modulator comprises:
   a phase shifter configured to split the LO signal into a first LO signal and a second LO signal respectively with a 0 degree phase shift and a 90 degree phase shift relative to the LO signal; and
   a pair of mixers configured to mix the RF signal with the first and second LO signals to respectively generate the down-converted I and Q signals.

3. The RF transmitter according to claim 1, wherein the LO is configured to generate the LO signal as a sine wave.

4. The RF transmitter according to claim 1, further comprising:
   a power and phase calculation module configured to convert a two dimensional (2D) Cartesian coordinate to a polar coordinate, wherein components of the 2D Cartesian coordinate are respectively defined by DC voltages of the down-converted I and Q signals, and wherein the polar coordinate is defined by a radial component and an angular component respectively representing the power of the RF signal and the phase of the RF signal.

5. The RF transmitter according to claim 1, further comprising:
   a directional coupler configured to distribute the RF signal to an antenna and to the IQ de-modulator, wherein the directional coupler couples the RF signal to the IQ de-modulator in only one direction.

6. The RF transmitter according to claim 1, further comprising:
   multiple power amplifiers configured to generate corresponding RF signals from the LO signal; and
   a multiplexer configured to selectively couple the RF signals to the IQ de-modulator.

7. The RF transmitter according claim 6, wherein the multiple power amplifiers drive corresponding antennas.

8. The RF transmitter according to claim 1, wherein the splitter is configured to split and distribute the LO signal with unity gain to the transmit amplifier and to the IQ de-modulator, and wherein the RF transmitter further comprises:
   a buffer configured to pass the LO signal to the splitter while translating between an output impedance of the LO and an input impedance of the splitter.

9. The RF transmitter according to claim 1, wherein the splitter is directly electrically coupled to the transmit amplifier through the first splitter output, and wherein the splitter is directly electrically coupled to the IQ de-modulator through the second splitter output.

10. A radio frequency (RF) transmitter comprising:
    a local oscillator (LO) configured to generate a LO signal;
    a transmit circuit configured to generate an RF signal from the LO signal, wherein the LO and RF signals are periodic and share both a waveform and a frequency;
    a de-modulator comprising:
       a phase shifter configured to split the LO signal into a first LO signal and a second LO signal respectively with a 0 degree phase shift and a 90 degree phase shift relative to the LO signal; and
       a pair of mixers configured to mix the RF signal with the first and second LO signals to respectively generate a down-converted in-phase (I) signal and a down-converted quadrature (Q) signal;
    a power and phase module configured to determine a phase of the RF signal and/or a power of the RF signal from the down-converted I and Q signals; and
    a splitter comprising a first splitter output and a second splitter output, wherein the splitter is configured to split the LO signal and to output the LO signal to the first splitter output and the second splitter output, wherein the first splitter output is electrically coupled to the transmit circuit, and wherein the second splitter output is electrically coupled to the phase shifter.

11. The RF transmitter according to claim 10, further comprising:
    a directional coupler, wherein the RF signal passes unfiltered from an output of the directional coupler to inputs of the mixers.

12. The RF transmitter according to claim 10, wherein the second splitter output is directly electrically coupled to the phase shifter.

13. The RF transmitter according to claim 10, wherein the first splitter output is directly electrically coupled to the transmit circuit.

14. A radio frequency (RF) transmitter comprising:
    a local oscillator (LO) configured to generate a LO signal;
    a transmit circuit configured to generate an RF signal from the LO signal;
    an IQ de-modulator configured to down convert the RF signal and the LO signal into a down-converted in-phase (I) signal and a down-converted quadrature (Q) signal, wherein the RF transmitter is configured to determine at least one of a phase of the RF signal or a power of the RF signal from the down-converted I and Q signals; and
    a splitter having a first splitter output and a second splitter output, wherein the first and second splitter outputs are electrically coupled respectively to the transmit circuit and the IQ de-modulator, and wherein the splitter is configured to split the LO signal and to output the LO signal to the first and second splitter outputs.

15. The RF transmitter according to claim 14, wherein the transmit circuit is directly electrically coupled to the first splitter output.

16. The RF transmitter according to claim 14, wherein the IQ de-modulator is directly electrically coupled to the second splitter output.

17. The RF transmitter according to claim 14, wherein the transmit circuit is directly electrically coupled to the first splitter output, and wherein the IQ de-modulator is directly electrically coupled to the second splitter output.

18. The RF transmitter according to claim 14, wherein the RF transmitter is configured to determine the phase of the RF signal with a resolution of 360 degrees.

19. The RF transmitter according to claim 14, wherein the LO signal is the same at an input of the transmit circuit as at an input of the IQ de-modulator.

20. The RF transmitter according to claim 14, wherein the RF transmitter is configured to determine both the phase of the RF signal and the power of the RF signal.

* * * * *